United States Patent
Lee et al.

(10) Patent No.: US 8,726,215 B2
(45) Date of Patent: May 13, 2014

(54) STANDARD CELL PLACEMENT TECHNIQUE FOR DOUBLE PATTERNING TECHNOLOGY

(75) Inventors: John Jung Lee, San Jose, CA (US);
Gary K. Yeap, Fremont, CA (US);
Renata Zaliznyak, Saratoga, CA (US);
Paul David Friedberg, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/196,640

(22) Filed: Aug. 2, 2011

(65) Prior Publication Data

US 2013/0036397 A1 Feb. 7, 2013

(51) Int. Cl.
*G06F 17/50* (2006.01)
(52) U.S. Cl.
USPC ........... 716/119; 716/118; 716/126; 716/111; 716/112
(58) Field of Classification Search
USPC .................... 716/118, 119, 126, 111, 112
See application file for complete search history.

(56) References Cited

U.S. PATENT DOCUMENTS

| | | | |
|---|---|---|---|
| 6,505,323 B1 * | 1/2003 | Lipton et al. | 716/112 |
| 6,988,253 B1 * | 1/2006 | Lipton et al. | 716/112 |
| 7,927,928 B2 | 4/2011 | Pierrat | |
| 2003/0061583 A1 * | 3/2003 | Malhotra | 716/5 |
| 2008/0244503 A1 * | 10/2008 | Graur et al. | 716/19 |
| 2009/0217224 A1 * | 8/2009 | Wiaux et al. | 716/5 |
| 2010/0199253 A1 * | 8/2010 | Cheng et al. | 716/13 |
| 2011/0078638 A1 * | 3/2011 | Kahng et al. | 716/52 |
| 2011/0131544 A1 * | 6/2011 | Majumder et al. | 716/139 |
| 2012/0210279 A1 * | 8/2012 | Hsu et al. | 716/53 |

* cited by examiner

*Primary Examiner* — Nha Nguyen
*Assistant Examiner* — Brian Ngo
(74) *Attorney, Agent, or Firm* — Bever, Hoffman & Harms, LLP; Jeanette S. Harms

(57) ABSTRACT

A method for generating legal colorable multiple patterning standard cell placement is provided. In this method, a standard cell library including color information can be accessed. For each standard cell, edge labels can be assigned based on colors of objects within a predetermined distance from each edge. A truth table, which indicates legal spacing between pairs of standard cells based on their edge labels, can be accessed. A plurality of standard cells of a design can then be placed based on the truth table.

24 Claims, 8 Drawing Sheets

STANDARD CELL PLACEMENT TECHNIQUE FOR DOUBLE PATTERNING TECHNOLOGY

BACKGROUND OF THE INVENTION

1. Field of the Invention

The present invention relates to standard cell placement and in particular to such placement for double patterning technology.

2. Related Art

To fabricate an integrated circuit (IC), a designer can use an electronic design automation (EDA) tool to create a schematic design. This schematic design can include circuits that are coupled together to perform one or more functions. The schematic design is translated into a representation of an actual physical arrangement of materials, which upon completion is called a design layout. Typically, materials are arranged in multiple layers for an IC. Therefore, the design layout includes several design layers.

After the design layers are complete, a fabrication process is used to actually form the appropriate materials on each layer. This process includes a photolithographic process that directs a light source at a mask. In general, the mask has opaque and transparent regions that when illuminated causes light to fall on photosensitive material in a desired pattern. For example, after light is shined through the mask onto a photosensitive material (e.g. positive resist), the light-sensitive material is subjected to a developing process to remove those portions exposed to light (or, alternatively, remove those portions not exposed to light when using a negative resist). Etching, deposition, diffusion, or some other material altering process is then performed on the patterned layer until a particular material is formed with the desired pattern in that layer. The result of the process is a predetermined arrangement of material in each layer.

In one design technique, a designer can use a library of standard cells to form the circuits, which in turn can be coupled to provide the desired functionality. Each standard cell is a defined group of transistor and interconnect structures that provides a Boolean logic function (e.g. AND, OR, XOR, inversion, etc.) or a storage function (e.g. a flip-flop or a latch). Each standard cell also has a layout view, which provides an effective manufacturing blueprint for a material layer.

With increasing demand for greater functionality in smaller ICs as well as for more complex systems (including, for example, mixed signal and systems on chip), IC object geometries are being driven to ever smaller dimensions. Notably, the ability to project an accurate image of very small objects onto an IC substrate is limited in part by the wavelength of light used during photolithography. For example, current lithographic processes can use wavelengths of 193 nm, which can achieve minimum object sizes and spacing of approximately 70 nm. The minimum object spacing $\lambda$ on a mask is related to many factors, including the wavelength of light used. In general, a smaller wavelength leads to a smaller value of $\lambda$.

Unfortunately, the resolution limit of yet smaller object sizes is becoming difficult due to highly non-linear imaging behavior, which can magnify mask errors in non-intuitive ways. To improve resolution, a smaller wavelength of light (e.g. in the extreme ultraviolet (EUV) range) can theoretically be used, although it is quite difficult to use in actual IC fabrication. Therefore, designers have instead tried to use non-lithographic solutions to increase pattern density.

One such non-lithographic solution is called double patterning. In this technique, two masks can be used to expose the same IC substrate, thereby effectively doubling the object density in that layer. For example, FIG. 1A illustrates an exemplary target pattern 100, which because of the close spacing between objects would be impossible to print using a single mask. FIGS. 1B and 1C illustrate masks 101 and 102, respectively, which when exposed separately and subsequently combined can achieve the target pattern 100. Note that the cross hatching of the objects refers only to mask designation.

This technique can be extended to multiple patterning of N masks where N is an integer. The printable object spacing is reduced approximately by a factor of N because object spacing belonging to different masks is no longer limited by the wavelength of light. Regardless of design technique, given a set of objects to be printed, each object needs to be assigned to one and only one mask for photolithography. This procedure is called "coloring" or "color assignment" of objects where each color corresponds to a mask. The color assignment should be done such that objects in each mask of a particular color do not violate the minimum spacing limited by $\lambda$, which is related to the light wavelength. Note that with certain configurations in object layout, it is impossible to assign color to all objects such that all masks obey minimum spacing. This condition is called "un-colorable", "illegal (infeasible) color assignment", or "color conflict" by those skilled in the art. For example, FIG. 1F illustrates three objects 121, 122, and 123 with spacing $\mu$ (minimum spacing of different colored objects), which is less than $\lambda$ (minimum spacing of same colored objects) that cannot be legally assigned two colors with minimum spacing (i.e. not exceeding $\lambda$) on the same mask.

In a standard cell library design, the layout of all objects belonging to a single cell must be colorable when considering only the objects from that cell. The same must also hold true independently for all standard cells in the library. However, when two standard cells are placed side-by-side, illegal color assignment can occur. The set of un-colorable objects includes at least one object from each of the two standard cells.

Assuming that objects belonging to a standard cell are confined within its boundaries, i.e. edges, if two cells are spaced far enough apart, then the minimum spacing of objects originating from two different cells will meet the minimum distance requirement of a colored mask. Therefore, when a coloring conflict of two standard cells is detected, spacing must be inserted between the two standard cells to produce a colorable layout involving objects from the two standard cells. In a standard cell design, all standard cells need to be spaced such that all their respective objects are colorable given the placement of the standard cells.

The present invention, which is described in detail below, can provide an improved technique to generate a colorable placement of standard cells in an IC design.

SUMMARY OF THE INVENTION

A method for generating legal colorable multiple patterning standard cell placement is provided. In this method, a standard cell library including color information can be accessed. For each standard cell, edge labels can be assigned based on colors of objects within a predetermined distance from each edge. Exemplary edge labels can include {ZERO, SINGLE, DOUBLE}. In some embodiments, additional edge labels can include at least one of {DOUBLE TOP, DOUBLE BOTTOM, STRICT DOUBLE, LOOSE DOUBLE}. The predetermined distance can be $\lambda$, which is a parameter related to the wavelength of light used during the exposure. In one embodiment, each edge label can include an edge label qualifier {ANY, SAME, DIFF} to indicate a power/ground rail color relative to any objects within the predetermined distance from the edge.

A truth table, which indicates legal spacing between pairs of standard cells based on their edge labels, can be accessed (or in some embodiments, constructed). The legal spacing typically includes designations for 0 and 1 units for double patterning spacing, wherein a single unit is approximately λ.

Based on this truth table, a plurality of standard cells of a design can then be placed. An output placement report with legal spacing for the plurality of standard cells of the design can be generated.

In one embodiment, the method can further include generating the standard cell library including the color information using a color engine, color rules, and a GDS file of the design. A computer-readable medium storing computer-executable instructions for generating legal multiple patterning spacing for standard cells during placement is also described, wherein these instructions when executed by a processor perform the above-described steps.

DETAILED DESCRIPTION OF THE FIGURES

In double patterning lithography, objects are assigned colors, wherein each color is associated with a specific mask. In one embodiment, two colors, e.g. RED and BLUE, can be used for coloring. By using these colors, the objects can be divided between the two masks. That is, all RED objects can be formed on a first mask and all BLUE objects can be formed on a second mask. As described herein in the absence of color, the RED color is shown as a diagonal crosshatch pattern, the BLUE color is shown as a dot fill pattern, and UNASSIGNED (i.e. when a color is not yet assigned) is shown as a gray fade pattern.

Figure 1B:
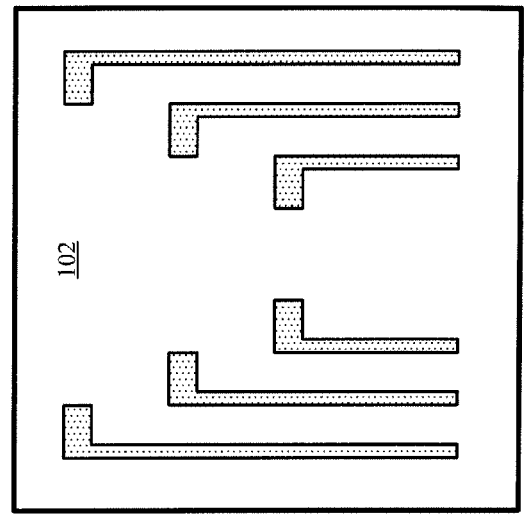
FIGS. 1B and 1C illustrate two masks that when exposed can achieve the target pattern of FIG. 1A.
Figure 1C:
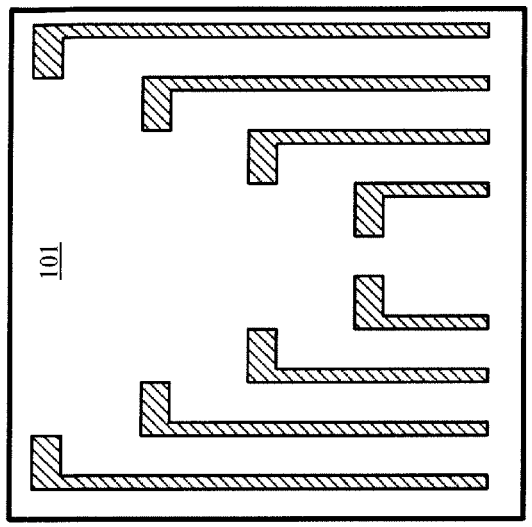
Figure 1A:
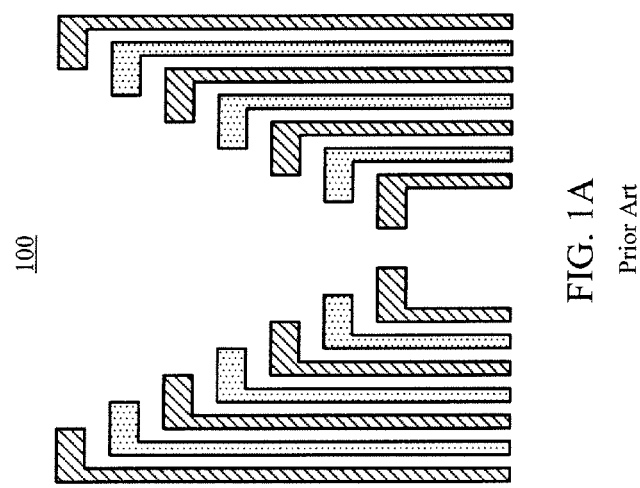
FIG. 1A illustrates an exemplary target pattern, which because of the close spacing between objects would be impossible to print using a single mask.
Figure 1D:
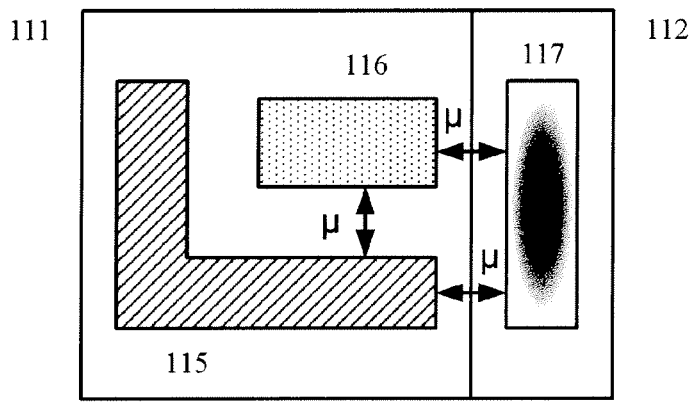
FIG. 1D illustrates an exemplary set of standard cells when placed adjacent without appropriate spacing for a colorable layout.

FIG. 1D illustrates an exemplary set of standard cells 111 and 112 when placed adjacent without appropriate spacing for a colorable layout. As shown, standard cell 111 has two objects 115 and 116, whereas standard cell 112 has a single object 117. As a general coloring rule, objects of different colors (and thus associated with different masks) can be placed very close together, e.g. at 0.5λ (also referenced as • herein), whereas objects of the same color must be placed further apart, e.g. at approximately λ (70 nm).

Referring to FIG. 1D, objects 115 and 116 are positioned • apart and therefore must be colored differently in standard cell 111. Standard cell 112 is not yet colored and therefore object 117 is UNASSIGNED. Because objects 115 and 116 are colored differently, object 117 can be placed a distance • apart from either of objects 115 and 116, but not both simultaneously. Therefore, standard cells 111 and 112 are not allowed to abut.

Figure 1E:
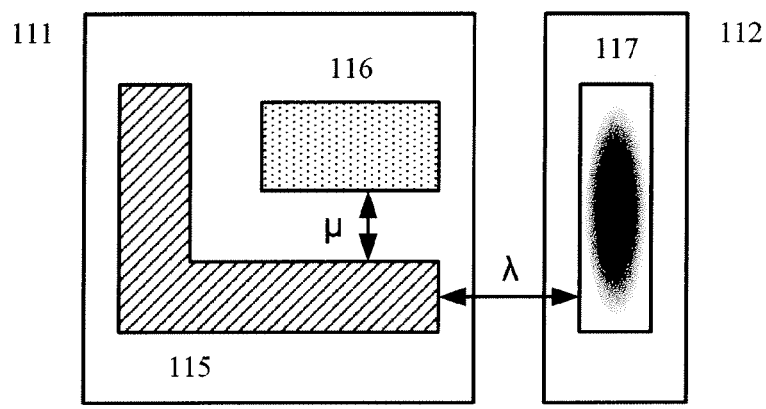
FIG. 1E illustrates an exemplary set of standard cells with appropriate spacing for a colorable layout.
Figure 1F:
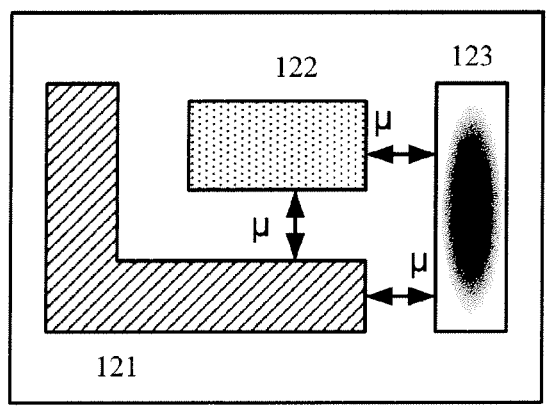
FIG. 1F illustrates three objects that cannot be legally assigned two colors with minimum spacing on the same mask.

Indeed, as shown in FIG. 1E, the general coloring rule mandates that object 117 (as UNASSIGNED) be placed λ apart from both objects 115 and 116, otherwise a "conflict" is created. This standard cell process is called legalizing placement. In accordance with a conventional double patterning spacing technique, a placer is responsible for identifying potential violations and separating cells as necessary (as shown in FIG. 1E).

This process would typically involve many iterations because the coloring of any one object may change, thereby necessitating the re-coloring of adjacent cells. For example, typical complex IC designs may require hundreds of thousands or even millions of iterations to legalize placement. As appreciated by those skilled in the art, a reduction of iterations can advantageously minimize computing system and silicon resources, both of which are expensive.

In accordance with one aspect of an improved double patterning spacing technique, the side edges (e.g. right and left edges) of each standard cell can be characterized as either SINGLE or DOUBLE. The SINGLE characterization means that only one color of object is within a predetermined distance from that edge. The DOUBLE characterization means that two colors of objects are within a predetermined distance from that edge. In one embodiment, the predetermined distance is λ.

In one simplified embodiment, standard cells with characterized edges can be quickly and legally placed. Notably, a truth table can be constructed that simplifies this placement process, thereby vastly minimizing the number of iterations needed to generate colorable placement of standard cells. TABLE 1, shown below, is an exemplary table that indicates the spacing for adjacent standard cells based on adjacent edge labels.

TABLE 1

| Truth Table | | | |
|---|---|---|---|
| Spacing Label | DOUBLE | SINGLE | ZERO |
| DOUBLE | 1 unit | 1 unit | 0 |
| SINGLE | 1 unit | 0 | 0 |
| ZERO | 0 | 0 | 0 |

Figure 2A:
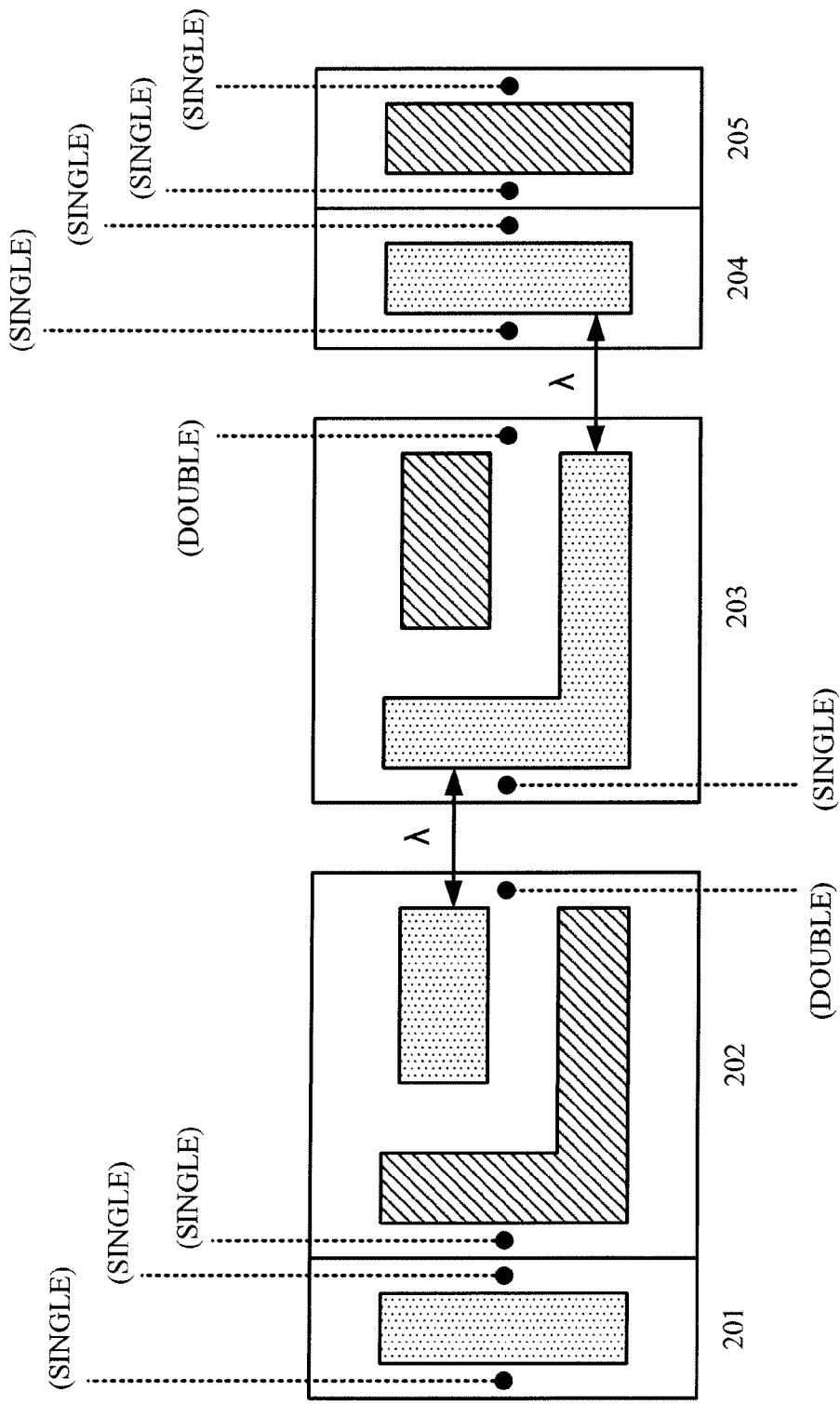
FIG. 2A illustrates various edge labels for exemplary standard cells.

For example, FIG. 2A illustrates the edge labeling for standard cells 201, 202, 203, 204, and 205. Specifically, standard cell 201 has edge labels SINGLE/SINGLE (left/right), standard cell 202 has edge labels SINGLE/DOUBLE, standard cell 203 has edge labels SINGLE/DOUBLE, standard cell 204 has edge labels SINGLE/SINGLE, and standard cell 205 has edge labels SINGLE/SINGLE. With these labels and referring to TABLE 1 (above), standard cells 201 and 202 can abut, i.e. have 0 unit spacing apart. Similarly, standard cells 204 and 205 can abut. In contrast, standard cells 202 and 203 must be placed 1 unit apart. Similarly, standard cells 203 and 204 must be placed 1 unit apart to satisfy same mask minimum spacing requirement of $\lambda$. Note that the "unit" may be defined differently for different cell libraries, lithography processes, designs, etc.

Note that in accordance with this truth table, two adjacent edges having the SINGLE labeling can theoretically abut, irrespective of their colors. When both two adjacent standard cells having shared SINGLE edges have the same color (e.g. if standard cells 204 and 205 were similarly colored, not shown), then one of the objects in those standard cells can be legally changed to comport with general coloring rules. Note that any sequence of objects with the coloring constraints that form an even cycle (e.g. RED, BLUE, RED, BLUE) is legal, whereas an odd cycle (e.g. RED, RED, BLUE) is not legal.

Note that some standard cells may not have an object within $\lambda$ of one of its edges. In that case, the edge can have a ZERO label. Referring back to TABLE 1, a ZERO edge can always abut either a DOUBLE or a SINGLE edge.

Figure 2B:
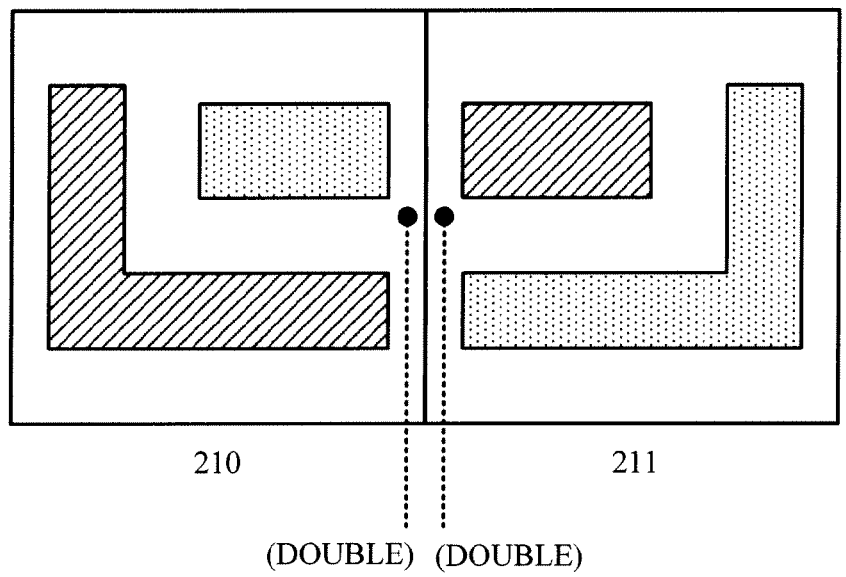
FIG. 2B illustrates two exemplary standard cells, which because of their specific colored objects can abut.
Figure 2C:
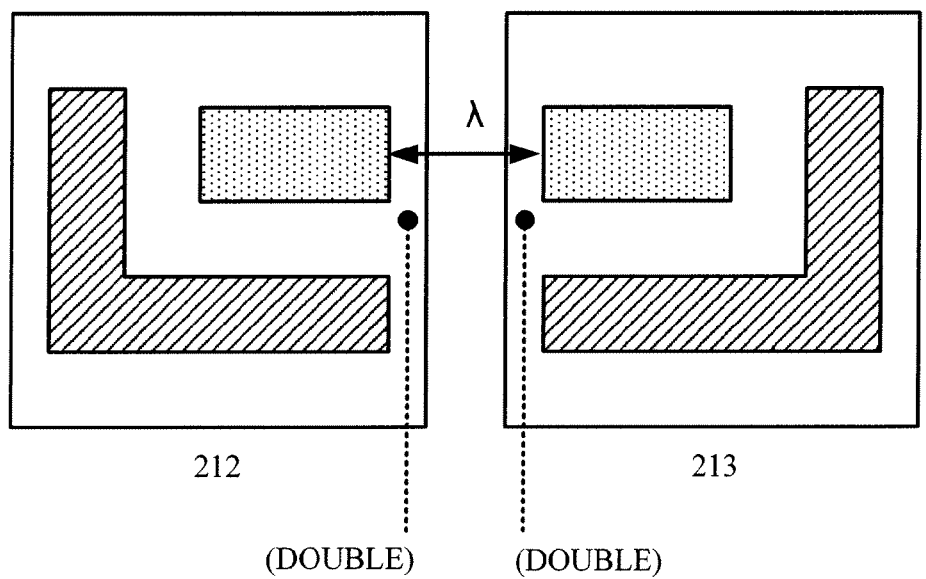
FIG. 2C illustrates two exemplary standard cells, which because of their specific colored objects cannot abut.
Figure 2D:
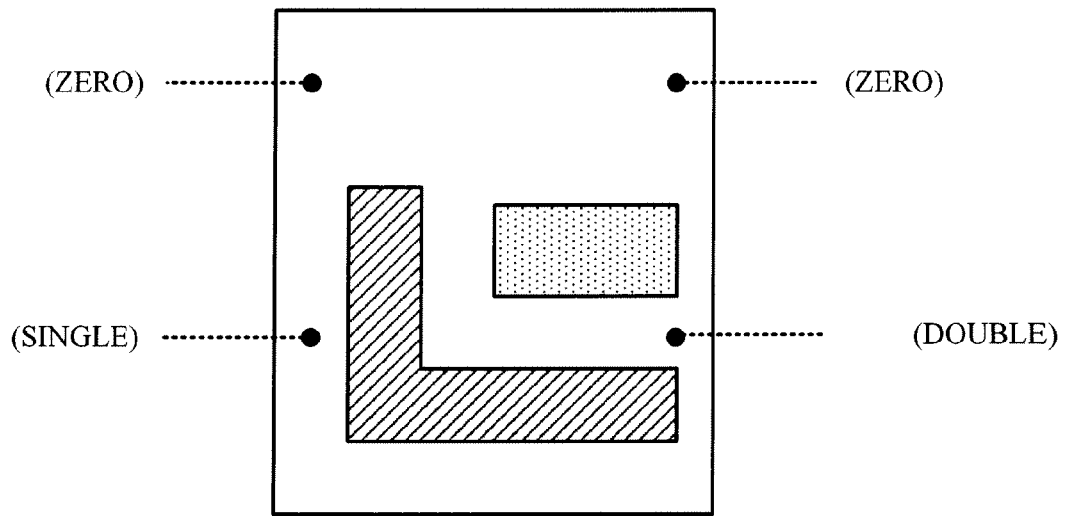
FIG. 2D illustrates an exemplary standard cell, which can be characterized using both top and bottom edge labels.
Figure 2E:
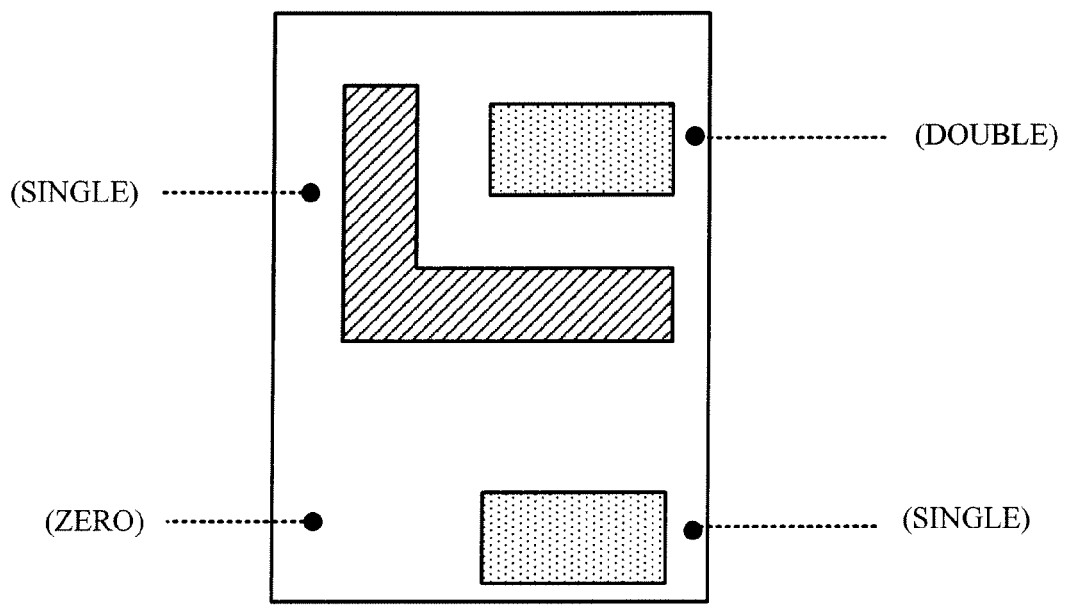
FIG. 2E illustrates another exemplary standard cell, which can be characterized using both top and bottom edge labels.

In one embodiment of an improved double patterning spacing technique, the truth table can be dynamically changed after one placement iteration has been performed to produce a better placement for the next placement iteration. For example, a designer may determine sometime during cell placement that some frequently-used standard cells with specific DOUBLE edges can abut. FIG. 2B illustrates two exemplary standard cells 210 and 211, which because of their specific colored objects can abut. This type of configuration could be termed a "loose" DOUBLE. In contrast, FIG. 2C illustrates two exemplary standard cells 212 and 213, which because of their specific colored objects cannot abut. This type of configuration could be termed a "strict" DOUBLE, which necessitates the 1 unit spacing. FIG. 2D illustrates an exemplary standard cell 221, which can be characterized using both top and bottom edge labels. Specifically, standard cell 221, in the configuration shown in FIG. 2D, can have edge labels of (TOP ZERO, BOTTOM SINGLE, TOP ZERO, BOTTOM DOUBLE)(left top, left bottom, right top, right bottom). In contrast, a standard cell 222 in the configuration shown in FIG. 2E can have edge labels of (TOP SINGLE, BOTTOM ZERO, TOP DOUBLE, BOTTOM SINGLE). Thus, the truth table can account for any level of object/coloring complexity and can be modified dynamically during cell placement.

Figure 2F:
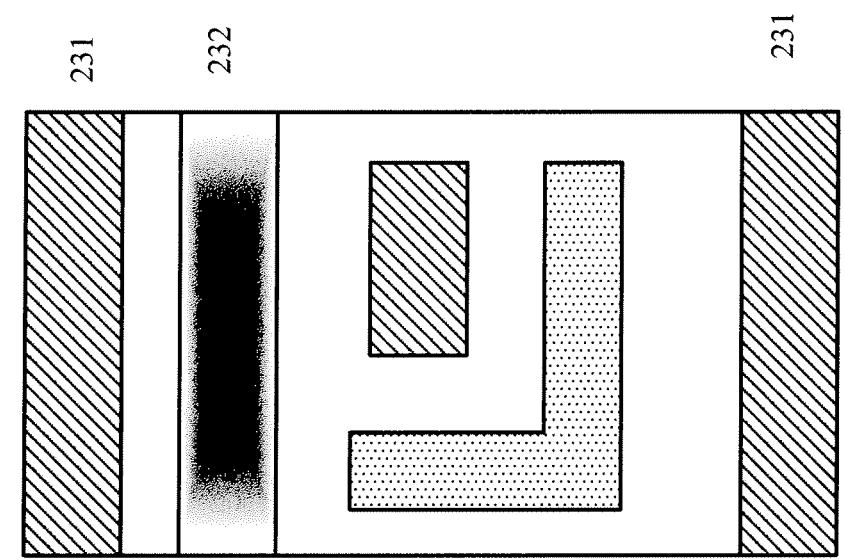
FIG. 2F illustrates a standard cell having power/ground lines and a clock line.

As known by those skilled in the art, each standard cell includes power and ground lines that are formed at the top and bottom edges. FIG. 2F illustrates a standard cell 230 having power/ground lines 231. Irrespective of whether the standard cells are abutting, the power and ground (PG) lines must connect and therefore must be the same color. Notably, some non-PG objects may also need to be connected across standard cells, e.g. clock lines. Standard cell 230 includes one clock line 232. In one embodiment, such connections (whether PG or non-PG) can be taken into account by using constraints in the placing algorithm, thereby forcing an object in another standard cell to change color to ensure optimized patterning (wherein one mask forming a line has better process control than two masks forming parts of that same line). In one embodiment, edge label qualifiers ANY, SAME, and DIFF can be added to the edge labels described above to indicate the color of the PG rail relative to the object(s) near the edge. For example, in one embodiment, SINGLE_ANY means there is a single color non-PG object and the PG could be of any color; SINGLE_SAME means there is a single color non-PG object and the PG is of the same color; and SINGLE_DIFF means there is a single color non-PG object and the PG is of the different color The truth table can be refined to take into account both PG and non-PG objects that connect across standard cells and should be similarly colored. TABLE 2 shows an exemplary (partial) implementation including the above-described additional label qualifiers (the ZERO label not shown for simplicity).

TABLE 2

Partial Truth Table

| | SINGLE_ANY | SINGLE_SAME | SINGLE_DIFF | DOUBLE |
|---|---|---|---|---|
| SINGLE_ANY | 0 | 0 | 0 | 1 |
| SINGLE_SAME | 0 | 1 | 0 | 1 |
| SINGLE_DIFF | 0 | 0 | 1 | 1 |
| DOUBLE | 1 | 1 | 1 | 1 |

Note that the above-described truth table can also be easily modified based on a triple patterning spacing technique. For example, the label "TRIPLE" can be included to account for three colors being within a predetermined distance of an edge.

Figure 3:
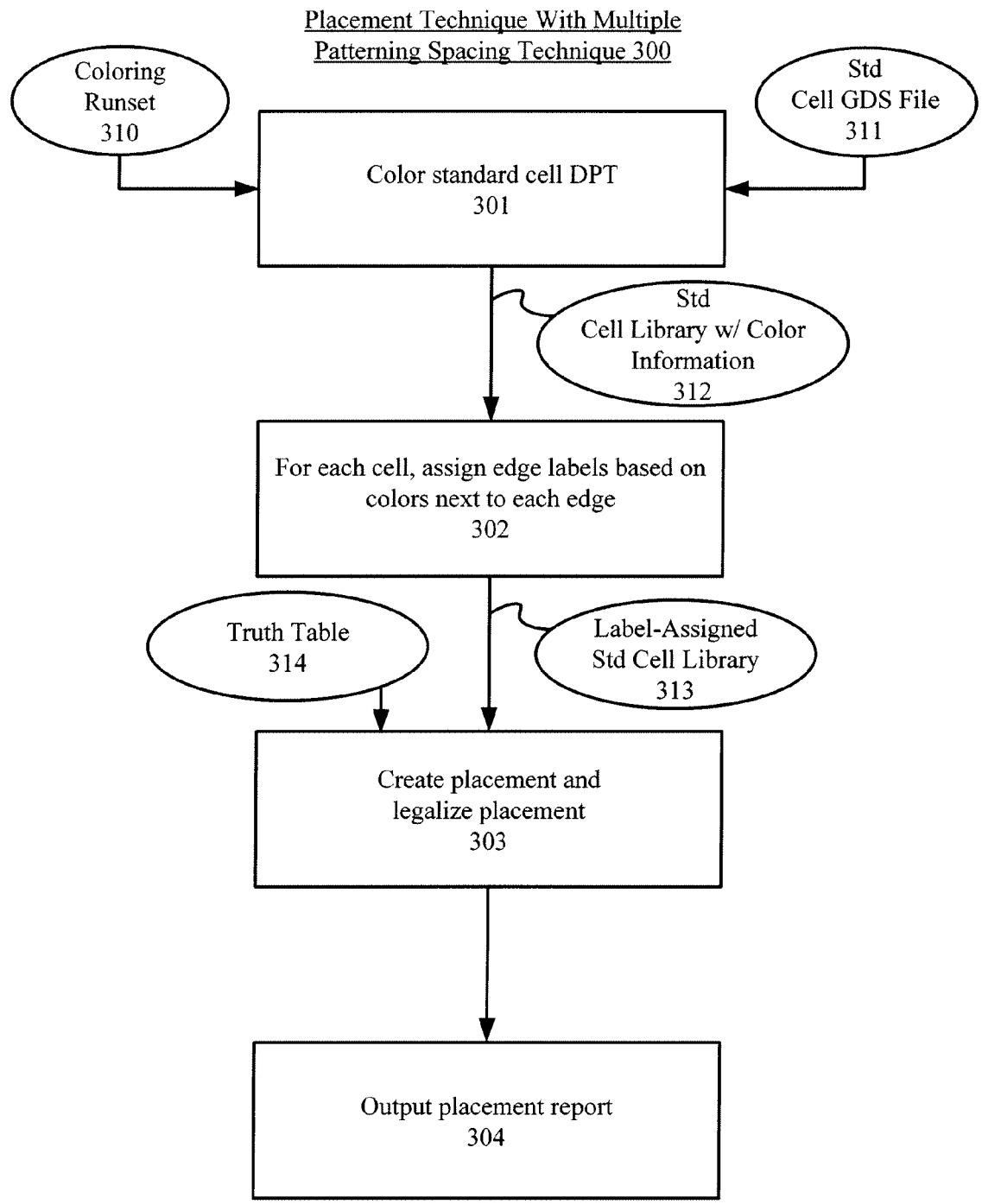
FIG. 3 illustrates a placement technique including a multiple patterning spacing technique, which includes edge labeling.

FIG. 3 illustrates a placement technique 300 with a multiple patterning spacing technique, which includes edge labeling. Step 301 can assign a color for each object of a standard cell. In one embodiment, the colors {RED, BLUE} can be used. As described above, in a double patterning spacing technique, all RED objects are placed on one mask, whereas all BLUE objects are placed on another mask. In one embodiment, any isolated objects in the design can be UNASSIGNED because such objects could be RED or BLUE and therefore can be placed on either mask. An isolated object can be defined as an object at least $\lambda$ from any other object. This designation provides additional placement flexibility, particularly when the isolated object is at an edge of the standard cell.

To perform the color assignment of step 301, a coloring runset 310 (i.e. a coloring engine with a set of rules for color assignment) and a standard cell GDS (graphic database system containing objects for each cell) file 311 can be received as inputs. Using these inputs, step 301 can output a standard cell library 312. In one embodiment, the color information can be included in standard cell library 312 as a stand-alone file. Note that standard cell library 312 can be generated off-line and merely accessed when a designer is ready to perform edge labeling.

For example, step 302 can access standard cell library 312 and then assign spacing labels based on the number of colors of objects within a predetermined distance of each left/right standard cell edge. In one embodiment, the predetermined distance is within λ of a standard cell edge. Note that step 302 may ignore power/ground lines, which are ubiquitous for standard cells, as well as other inter-cell connecting lines (e.g. clock lines and other long lines that cross multiple standard cells).

As described above, if a standard cell edge has only one colored object within λ, then that edge can be assigned a spacing label of "SINGLE". In contrast, a standard cell edge with two or more colored objects within λ can be assigned a spacing label of "DOUBLE". A standard cell edge with no colored objects within λ can be assigned a spacing label of "ZERO". Further refinements to this labeling, e.g. DOUBLE TOP, DOUBLE BOTTOM, STRICT DOUBLE, LOOSE DOUBLE, etc., can be used. In one embodiment, step 302 can output a label-assigned standard cell library 313. Note that label-assigned standard cell library 313 can include a stand-alone file with the spacing labels in lieu of modifying each standard cell.

Step 303 can access label-assigned standard cell library 313 and a truth table 314 (see, e.g. TABLE 1) to create and legalize (colorable) placement. In one embodiment, legalizing placement can include consulting the above-described truth table to ensure legality. In one embodiment, truth table 314 can be included as part of label-assigned standard cell library 313. Step 304 can output a placement report including minimally-spaced double patterning standard cells.

Technique 300 can provide a simple flow for standard cell spacing assignment, which is correct by construction. Moreover, technique 300 only minimally increases placer run time with minimal (or no) input from a designer. That is, while state-of-the-art IC designs may be implemented with millions of standard cells, there are typically on the order of one to two thousand reference standard cells. Therefore, generating and including the above-described spacing labels for each reference standard cell takes minimal time and significantly reduces placing complexity.

Figure 4:
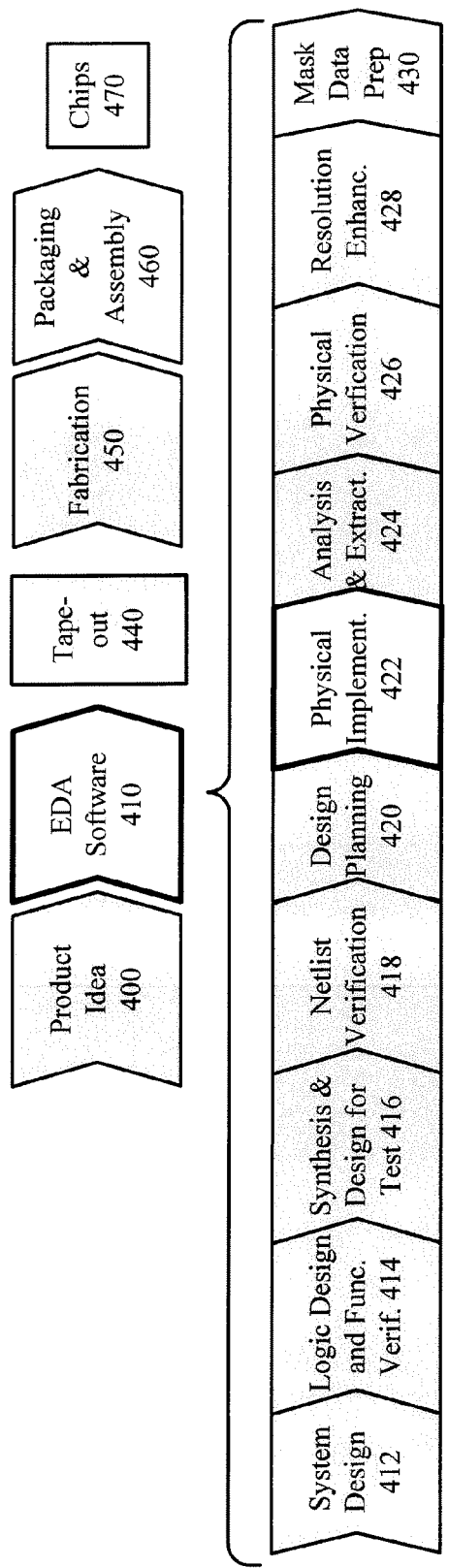
FIG. 4 shows a simplified representation of an exemplary digital ASIC design flow.

FIG. 4 shows a simplified representation of an exemplary digital ASIC design flow. At a high level, the process starts with the product idea (step 400) and is realized in an EDA software design process (step 410). When the design is finalized, it can be taped-out (event 440). After tape out, the fabrication process (step 450) and packaging and assembly processes (step 460) occur resulting, ultimately, in finished chips (result 470).

The EDA software design process (step 410) is actually composed of a number of steps 412-430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 410) will now be provided:

System design (step 412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, DFTMAX, TetraMAX, and DesignWare® products.

Netlist verification (step 418): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 420): Here, an overall floorplan for the chip is constructed and analyzed for timing and top-level routing. Exemplary EDA software products from Synopsys, Inc. that can be used at this step include Astro and IC Compiler products.

Physical implementation (step 422): The placement (positioning of circuit elements) and routing (connection of the same) occurs at this step. Exemplary EDA software products from Synopsys, Inc. that can be used at this step include Astro, and IC Compiler products. In one embodiment, multiple patterning spacing technique 300 (FIG. 3) can be used in step 422.

Analysis and extraction (step 424): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 426): At this step various checking functions are performed to ensure correctness for: manufacturing, electrical issues, lithographic issues, and circuitry. Exemplary EDA software products from Synopsys, Inc. that can be used at this step include the IC Validator and Hercules products.

Resolution enhancement (step 428): This step involves geometric manipulations of the layout to improve manufacturability of the design. Exemplary EDA software products from Synopsys, Inc. that can be used at this step include Proteus, ProteusAF, and PSMGen products.

Mask data preparation (step 430): This step provides the "tape-out" data for production of masks for lithographic use to produce finished chips. Exemplary EDA software products from Synopsys, Inc. that can be used at this step include the CATS(R) family of products.

The above-described double patterning technique can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. For example, in one embodiment. As such, many modifications and variations will be apparent. Note that the above-described multiple patterning spacing technique can be used on any appropriate IC layer. For example, a tool implementing the multiple patterning spacing technique can include independent cell labeling and rules for each affected metal layer. Specifically, labels such as SINGLE_ANY_M1, SINGLE_ANY_M2, etc., can be used in separate truth tables for each layer. Accordingly, it is intended that the scope of the invention be defined by the following Claims and their equivalents.

The invention claimed is:

1. A method for generating legal multiple patterning spacing for standard cells during placement, the method comprising:
   accessing a standard cell library having color information, each color indicating object assignment to one of a plurality of masks, each object of a standard cell being given a color;
   assigning, for each standard cell, edge labels based on a number of colors within a predetermined distance from each edge;
   accessing a table that indicates legal spacing between pairs of standard cells based on their edge labels; and
   placing a plurality of standard cells for a design based on the legal spacing,
   the method being performed using a computer.

2. The method of claim 1, further including generating an output placement report with the legal spacing for the plurality of standard cells for the design.

3. The method of claim 1, wherein each edge has at least one edge label, and wherein the edge labels include ZERO, SINGLE, and DOUBLE.

4. The method of claim 3, wherein the edge labels further include at least one of ANY and SAME.

5. The method of claim 4, wherein the edge labels further include at least one of DOUBLE TOP, DOUBLE BOTTOM, STRICT DOUBLE, and LOOSE DOUBLE.

6. The method of claim 1, further including constructing the table.

7. The method of claim 1, further including generating the standard cell library having color information using a color engine, color rules, and a GDS file of the design.

8. The method of claim 1, wherein the predetermined distance is $\lambda$, which is a wavelength of light used during exposure.

9. The method of claim 1, wherein the legal spacing includes designations for 0 and 1 units.

10. The method of claim 9, wherein a unit refers to $\lambda$, which is a wavelength of light used during exposure.

11. The method of claim 10, wherein the legal spacing further includes a designation for 2 units.

12. The method of claim 1, wherein the table conforms to that shown in TABLE 1.

13. A computer-readable medium storing computer-executable instructions for generating legal multiple patterning spacing for standard cells during placement, the computer-readable medium being non-transitory, the instructions when executed by a processor perform a process comprising:
    accessing a standard cell library having color information, each color indicating object assignment to one of a plurality of masks, each object of a standard cell being given a color;
    assigning, for each standard cell, edge labels based on a number of colors within a predetermined distance from each edge;
    accessing a table that indicates legal spacing between pairs of standard cells based on their edge labels; and
    placing a plurality of standard cells for a design based on the legal spacing.

14. The computer-readable medium of claim 13, further including generating an output placement report with the legal spacing for the plurality of standard cells for the design.

15. The computer-readable medium of claim 13, wherein each edge has at least one edge label, and wherein the edge labels include ZERO, SINGLE, and DOUBLE.

16. The computer-readable medium of claim 15, wherein the edge labels further include at least one of ANY and SAME.

17. The computer-readable medium of claim 16, wherein the edge labels further include at least one of DOUBLE TOP, DOUBLE BOTTOM, STRICT DOUBLE, and LOOSE DOUBLE.

18. The computer-readable medium of claim 13, further including constructing the truth table.

19. The computer-readable medium of claim 13, further including generating the standard cell library having color information using a color engine, color rules, and a GDS file of the design.

20. The computer-readable medium of claim 13, wherein the predetermined distance is $\lambda$, which is a wavelength of light used during exposure.

21. The computer-readable medium of claim 13, wherein the legal spacing includes designations for 0 and 1 units.

22. The computer-readable medium of claim 21, wherein a unit refers to $\lambda$, which is a wavelength of light used during exposure.

23. The computer-readable medium of claim 22, wherein the legal spacing further includes a designation for 2 units.

24. The computer-readable medium of claim 13, wherein the table conforms to that shown in TABLE 1.

* * * * *